United States Patent [19]
Bhagwan et al.

[11] Patent Number: 5,675,298
[45] Date of Patent: Oct. 7, 1997

[54] LOW-LOSS, LOW-INDUCTANCE INTERCONNECT FOR MICROCIRCUITS

[75] Inventors: Raghunand Bhagwan, Sunnyvale; Alan Rogers, Palo Alto; John MacDonald, San Jose, all of Calif.

[73] Assignee: Sun Microsystems, Inc., Mountain View, Calif.

[21] Appl. No.: 561,339

[22] Filed: Nov. 21, 1995

[51] Int. Cl.⁶ .................................. H01P 3/08; H01P 5/00
[52] U.S. Cl. ......................... 333/1; 174/117 F; 333/236
[58] Field of Search ................................. 333/1, 236, 238, 333/24 R, 128; 174/117 F, 117 FF, 117 R, 129 R, 129 B

[56] References Cited

U.S. PATENT DOCUMENTS

| | | | |
|---|---|---|---|
| 3,179,904 | 4/1965 | Paulsen | 333/1 |
| 3,763,306 | 10/1973 | Marshall | 174/117 F X |
| 4,835,496 | 5/1989 | Schellenberg et al. | 333/128 |
| 5,543,751 | 8/1996 | Stedman et al. | 333/128 X |

*Primary Examiner*—Paul Gensler
*Attorney, Agent, or Firm*—D'Alessandro & Ritchie

[57] ABSTRACT

A low-loss, low-inductance metal interconnect for an electrical signal in a microcircuit comprises a plurality of spaced-apart generally parallel metal interconnect lines disposed in a plane over an insulating layer. The metal interconnect lines are interleaved with and electrically insulated from a plurality of spaced-apart generally parallel metal lines disposed in the plane. The metal interconnect lines together comprise a signal interconnect path, and the metal lines are coupled to a fixed voltage potential, such as ground.

4 Claims, 2 Drawing Sheets

LOW-LOSS, LOW-INDUCTANCE INTERCONNECT FOR MICROCIRCUITS

BACKGROUND OF THE INVENTION

1. Field of the Invention

The present invention relates to microcircuit technology. More particularly, the present invention relates to microcircuit interconnect technology and to a low-loss, low-inductance interconnect structure.

2. The Prior Art

As microcircuit device geometries get smaller and the signal rise and fall times become quicker, the bandwidth occupied by the signals increases. Microcircuit interconnect geometries have not scaled with device geometries, and so the interconnect used in previous IC generations is still called upon to handle the higher frequency signals of the present IC generation.

Two problems in particular have been observed with the present rise times in typical on-chip interconnects (typically metal lines) in integrated circuits. Every interconnect has associated with it an inductance. Depending on the value of the inductance, as well as on other factors, signal ringing may occur on the interconnect. This typically occurs when the value of the inductive reactance approaches and exceeds the value of the DC resistance, causing the conductor to behave as a transmission line. Improperly terminated lines may cause unwanted ringing. Further, wide lines exhibit the skin effect, causing the resistance of the lines to depart from their DC value for frequencies of interest as currents concentrate at the periphery of the conductor.

Referring first to FIG. 1, a cross-sectional view of a prior-art wide metal interconnect line is presented. Typical wide metal lines are used for applications such as clock lines in integrated circuits and, for the purposes of this disclosure, wide metal lines are ones whose resistance is insufficient to damp out inductive ringing effects. In the empirical experience of the inventors, such metal lines may have widths greater than about 20 microns for a particular VLSI process. Persons of ordinary skill in the art will expect some variation in this minimum width, depending on the particular circumstances.

The wide metal interconnect line of FIG. 1 may be used as a clock line or as another line carrying a high-frequency signal. Current on-chip clock rates can be about 500 MHz, and will soon approach 1 Ghz. At such frequencies, the skin effect will force much of the signal current to the edges of the wide metal interconnect line. In such a situation, the AC resistance of the wide metal interconnect line will become undesireably high, creating excessive ohmic losses. In addition, the inductive reactance will also be high, and the clock signal on the wide metal interconnect line may be subject to ringing under certain conditions where it is improperly terminated.

FIG. 2 is a graph showing the AC resistance and inductive reactance of the wide metal interconnect line of FIG. 1. The x-axis is frequency and the y-axis is resistance/impedance. The AC resistance of the wide metal interconnect line of FIG. 1 starts on the horizontal trace and continues as the dashed line labeled "R1". The Inductive reactance of the wide metal interconnect line of FIG. 1 is shown as the dashed line labeled "$j\omega L_1$".

As may be seen from an examination of the curve for the wide metal line in FIG. 2, the AC resistance (R1) of the wide metal interconnect line remains fairly constant at low frequencies, but begins to rise at a certain frequency and thereafter steadily increases as the skin effect begins to manifest itself. As may also be seen from FIG. 2, the inductive reactance ($j\omega L_1$) of the wide interconnect conductor expectedly rises with frequency. As the inductive reactance ($j\omega L_1$) approaches or exceeds the value of the ohmic resistance of the line, the line begins to behave as a transmission line.

As transistor geometries get increasingly smaller, the bandwidths occupied by the signals in integrated circuits increase. The bandwidth of a signal may be approximated by BW=0.5/(edge rate). For example, the highest frequency component in a signal with a rise time of 60 ps is 8.3 GHz.

These problems are known in the art. Several solutions have been offered in the prior art to solve them. Non-IC analogues related to these techniques are known, such as use of twisted pair cables and stranded wire. In the integrated circuit field, individual interconnect traces have been straddled by ground conductors. Parallel conductors have been strapped together at intervals. In addition, apertures have been etched in regions along the length and width of wide conductors. Despite the availability of these solutions to the aforementioned interconnect problems, there still remains room for improvement of high-frequency response in wide interconnect conductors in microcircuit interconnect architecture.

BRIEF DESCRIPTION OF THE INVENTION

A low-loss, low-inductance metal interconnect for an electrical signal comprises a plurality of spaced-apart generally parallel metal interconnect lines disposed in a plane over an insulating layer. The metal interconnect lines are electrically connected to one another and are interleaved with and electrically insulated from a plurality of spaced-apart generally parallel metal lines disposed in the plane. The metal lines are the outside-most lines. The metal interconnect lines together comprise a signal interconnect path, and the metal lines are coupled to the return path, such as ground or another fixed voltage potential.

A method for providing a low-loss, low-inductance metal interconnect for an electrical signal comprises the steps of providing a plurality of spaced-apart generally parallel metal interconnect lines disposed in a plane over an insulating layer, providing a plurality of spaced-apart generally parallel metal lines disposed in the plane interleaved with and electrically insulated from the metal interconnect lines, connecting all of the metal interconnect lines to a single signal source, and connecting the metal lines to the return path, such as ground or another fixed voltage potential.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
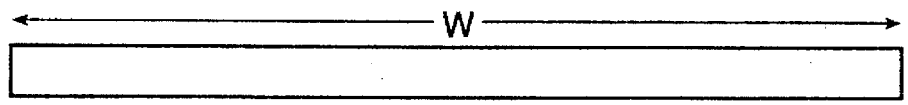
FIG. 1 is a cross-sectional view of a prior-art wide metal interconnect line.
Figure 3:
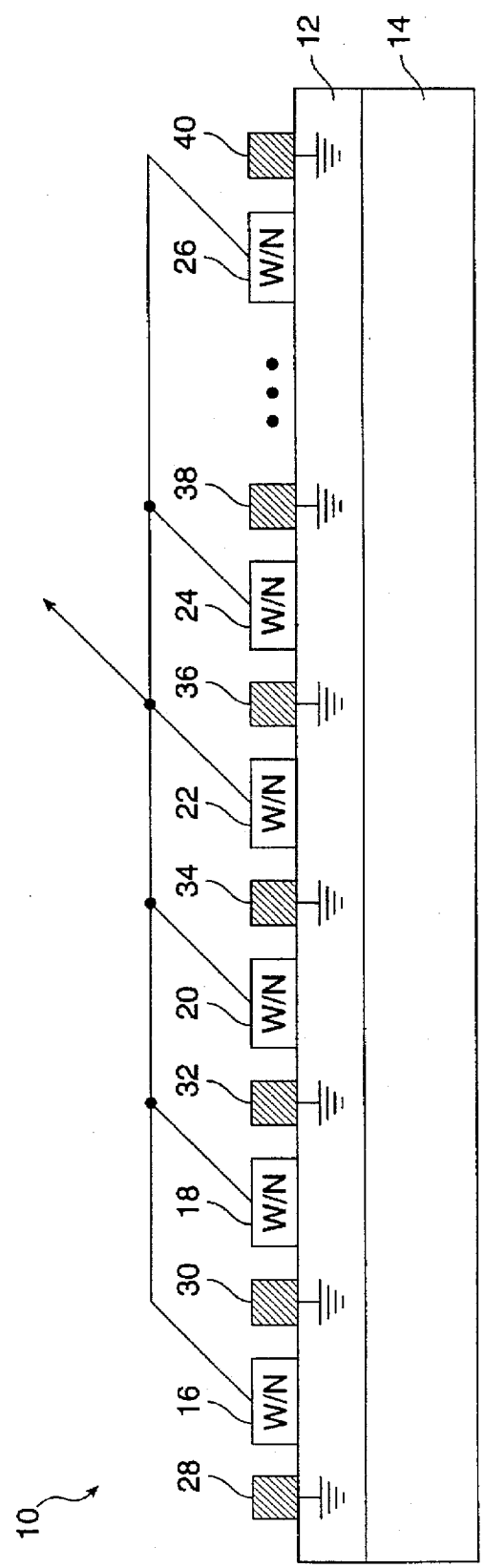
FIG. 3 is a cross-sectional view of a composite metal line according to the present invention having a width equivalent to that of the metal line of FIG. 1.

According to the present invention, the performance of the wide metal interconnect line of FIG. 1 when carrying high frequency signals may be improved. Referring now to FIG. 3, a segmented wide metal interconnect line 10 is shown in cross-sectional view disposed over insulating layer 12 on substrate 14. Those of ordinary skill in the art will readily recognize that substrate 14 schematically represents an integrated circuit containing active and/or passive devices in various layers of materials including the substrate and other layers. Those of ordinary skill in the art will recognize that other metal layers, possibly above and/or below metal interconnect line 10, will exist in the completed structure and that interconnect line 10 will be covered by an additional dielectric layer (not shown).

Segmented wide metal interconnect line 10 comprises a plurality of parallel metal interconnect lines bounded by and individually separated by a plurality of metal lines which are connected to a fixed voltage potential such as ground or the Vcc bus of the integrated circuit on which they are located. In the illustrative embodiment illustrated in FIG. 3 containing n parallel interconnect conductors, six such conductors 16, 18, 20, 22, 24, and 26 are shown, but those of ordinary skill in the art will recognize that the present invention is not limited to the disclosed embodiment having six parallel conductors and that other numbers of conductors may be employed. Taken together, parallel interconnect conductors 16, 18, 20, 22, 24, and 26, are the cross sectional equivalent of the prior-art metal line of FIG. 1.

Typically, where the prior-art metal line has a width w, each one of parallel interconnect conductors 16, 18, 20, 22, 24, and 26 will have a width of w/n where n is the number of parallel interconnect conductors. In the example illustrated in FIG. 3 where n=6, each one of parallel interconnect conductors 16, 18, 20, 22, 24, and 26 will have a width of 10 microns to provide the equivalent of a 60 micron wide metal line.

A plurality of metal lines 28, 30, 32, 34, 36, 38, and 40 are interposed in between and to the outside of parallel interconnect conductors 16, 18, 20, 22, 24, and 26. As shown in FIG. 3, metal lines 28, 30, 32, 34, 36, 38, and 40 may each have a width equal to about the minimum feature size for the process technology employed, presently typically 1 micron. Persons skilled in the art will understand that wider lines could be used. They are connected together to a fixed voltage source, such as ground or Vcc, on the microcircuit die. In a typical embodiment of the present invention, the spacing between adjacent parallel interconnect conductors 16, 18, 20, 22, 24, and 26 and metal lines 28, 30, 32, 34, 36, 38, and 40 may be the minimum line width for the process technology, presently typically less than about 1 micron. Those of ordinary skill in the art will recognize that larger spacings could be employed.

In the interconnect arrangement according to the present invention, the inductance of the metal interconnect line is reduced due the closely spaced return loops for the current provided by the interleaved fixed potential lines.

Table 1 compares the prior-art interconnect line of FIG. 1 with the segmented wide metal interconnect line of the present invention. The first column of Table 1 is for a 50 micron wide prior-art metal line, the second column is for a segmented wide metal interconnect line according to the present invention comprising five 10 micron wide metal lines with grounded metal lines between them having widths preferably about minimum feature size, and the third column is for a segmented wide metal interconnect line according to the present invention comprising ten 5 micron wide metal lines with grounded metal lines between them. The R, L, and C in Table 1 are in ohms, henrys, and, farads per micron.

TABLE 1

|  | One 50 Micron Line | Five 10 Micron Lines | Ten 5 Micron Lines |
| --- | --- | --- | --- |
| R @ 1 GHz | 1.18 e-3 | 1.08 e-3 | 0.985 e-3 |
| R @ 5 GHZ | 1.61 e-3 | 1.18 e-3 | 1.0 e-3 |
| L | 2.51 e-13 | 5.31 e-14 | 2.85 e-14 |
| ωL @ 5 GHz | 7.88 e-3 | 1.66 e-3 | 0.89 e-3 |
| C | 1.86 e-16 | 8.78 e-16 | 1.64 e-15 |

As may be seen from in the third column of Table 1, R>2πfL when the configuration comprising ten segments of interconnect conductor interspersed with eleven grounded lines is used. Therefore the wide metal interconnect line may be approximated as an RC line. There is a decrease in AC resistance due to the skin effect. The capacitance of the line, however, does increase. Those of ordinary skill in the art will recognize, however, that the figures above represent the capacitance of the metal line in isolation, and that the total capacitance experienced by the metal line will be greater in an actual integrated circuit where other adjacent metal layers are present. This fact effectively reduces the overall percentage capacitance change effected by employing the scheme of the present invention. The percentage inductance change will be unaffected by these considerations.

Figure 2:
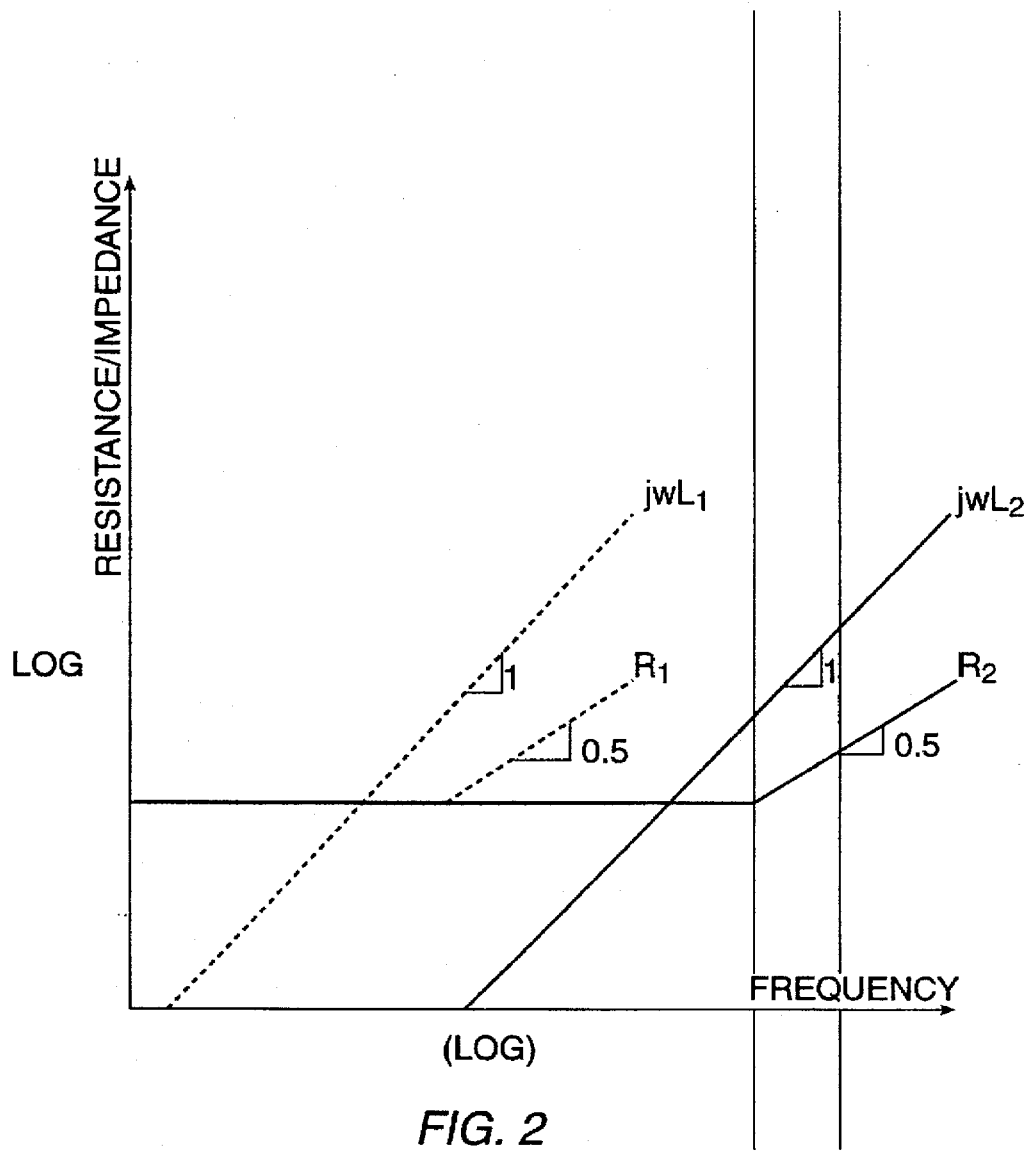
FIG. 2 is a graph showing the resistance and inductive reactance of the metal interconnect line of FIG. 1.

The graph of FIG. 2 includes a curve for the segmented wide metal interconnect line of the present invention and permits a comparison of the performance of segmented wide metal interconnect line of the present invention and the prior art metal line of FIG. 1. The AC resistance of the segmented wide metal interconnect line of the present invention starts along the same horizontal line as does the resistance trace for the prior-art wide metal line, but the knee of the curve where the resistance starts to increase as the solid line labeled "R2" occurs at a substantially higher frequency than does the dashed line labeled "R1". In addition, the inductive reactance of the segmented wide metal interconnect line of the present invention is shown as the dashed line labeled "jωL$_2$" which may be seen to lie to the right of the similar trace for the prior-art wide metal interconnect line of FIG. 1, indicating significantly lower inductive reactance than that of the prior-art wide metal interconnect line at equal frequencies, Those of ordinary skill in the art will recognize that FIG. 2 is a comparative graph and does not purport to accurately quantify resistance and reactance.

As a rule of thumb for the present invention, the segmentation of metal interconnect lines begins to provide a benefit in cases where w>>δ, where w is the width of the metal line and δ is the skin depth (depth of penetration of the current density into the metal line) calculable using the well-known formula:

$$\delta = \sqrt{\frac{\rho}{\pi f \mu_0}}$$

where ρ is the resistivity of the metal line, f is the frequency, and μ$_0$ is the magnetic permeability of free space. For the purposes of this disclosure, >>(much greater than) means w is greater than about 4δ although this number may vary in par.

The present invention is particularly useful as the bandwidth of the signals on the interconnect line exceeds about 1 GHz.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A metal interconnect for an electrical signal comprising a plurality of spaced-apart generally parallel metal interconnect lines disposed in a plane over an insulating layer and electrically connected together, said metal interconnect lines interleaved with and electrically insulated from a plurality of spaced-apart generally parallel metal lines disposed in said plane, wherein ones of said metal lines are the outermost lines, said metal interconnect lines together comprising a single signal interconnect path, said metal lines comprising a low impedance signal return path coupled to a fixed voltage potential.

2. A metal interconnect for an electrical signal comprising:

a plurality of spaced-apart generally parallel metal interconnect lines disposed in a plane over an insulating layer and electrically connected together;

a plurality of spaced-apart generally parallel metal lines disposed in said plane and interleaved with and electrically insulated from said metal interconnect lines said metal lines coupled to a fixed voltage potential, wherein ones of said metal lines are the outermost lines;

wherein said metal interconnect lines together comprise a single signal interconnect path for signals having a bandwidth exceeding about 1 GHz.

3. A metal interconnect for an electrical signal comprising a plurality of spaced-apart generally parallel metal interconnect lines disposed in a plane over an insulating layer and electrically connected together, said metal interconnect lines interleaved with and electrically insulated from a plurality of spaced-apart generally parallel metal lines disposed in said plane, wherein ones of said metal lines are the outermost lines, said metal interconnect lines together comprising a single signal interconnect path and having a cumulative width w, wherein $w \gg \delta$, wherein $\delta$ is the skin depth, said metal lines coupled to a fixed voltage potential.

4. A method for providing a metal interconnect for an electrical signal comprising the steps of:

providing a plurality of spaced-apart generally parallel metal interconnect lines disposed in a plane over an insulating layer;

providing a plurality of spaced-apart generally parallel metal lines disposed in said plane interleaved with and electrically insulated from said metal interconnect lines, wherein ones of said metal lines are the outermost lines;

connecting said metal interconnect lines together to a single signal source; and connecting said metal lines to a fixed voltage potential.

\* \* \* \* \*

UNITED STATES PATENT AND TRADEMARK OFFICE
CERTIFICATE OF CORRECTION

PATENT NO.   : 5,675,298
DATED        : October 7, 1997
INVENTOR(S)  : Raghunand Bhagwan, Alan Rogers and John MacDonald It is certified that error appears in the above-identified patent and that said Letters Patent is hereby corrected as shown below:

Column 4, line 2: replace "and, farads" with --and farads--.

Signed and Sealed this

Third Day of February, 1998

Attest:

BRUCE LEHMAN

Attesting Officer

Commissioner of Patents and Trademarks